United States Patent
Ishido et al.

(10) Patent No.: US 10,256,196 B2
(45) Date of Patent: Apr. 9, 2019

(54) SEMICONDUCTOR DEVICE AND METHOD FOR MANUFACTURING SAME

(71) Applicant: J-DEVICES CORPORATION, Usuki-shi, Oita (JP)

(72) Inventors: Kiminori Ishido, Yokohama (JP); Michiaki Tamakawa, Yokohama (JP); Toshihiro Iwasaki, Yokohama (JP)

(73) Assignee: J-DEVICES CORPORATION, Usuki-shi, Oita (JP)

( * ) Notice: Subject to any disclaimer, the term of this patent is extended or adjusted under 35 U.S.C. 154(b) by 0 days.

(21) Appl. No.: 15/198,785

(22) Filed: Jun. 30, 2016

(65) Prior Publication Data

US 2017/0005044 A1 Jan. 5, 2017

(30) Foreign Application Priority Data

Jul. 3, 2015 (JP) .................................. 2015-134137

(51) Int. Cl.
*H01L 21/48* (2006.01)
*H01L 21/56* (2006.01)
(Continued)

(52) U.S. Cl.
CPC ........ *H01L 23/562* (2013.01); *H01L 21/4853* (2013.01); *H01L 23/3121* (2013.01);
(Continued)

(58) Field of Classification Search
CPC .............. H01L 23/562; H01L 23/3121; H01L 23/49838; H01L 21/4853; H01L 21/56;
(Continued)

(56) References Cited

U.S. PATENT DOCUMENTS 5,041,699 A * 8/1991 Soliday .................. H05K 1/021
174/255
5,674,785 A * 10/1997 Akram .................... H01L 23/13
257/E23.004
(Continued)

FOREIGN PATENT DOCUMENTS

JP 2009-033114 A 2/2009
JP 2010-219489 A 9/2010
(Continued)

OTHER PUBLICATIONS

Japanese Office action for corresponding application No. 2015-134137, dated Dec. 12, 2018 (6 pgs).
English language Concise Explanation of Relevance (2 pgs).

*Primary Examiner* — Caridad Everhart
(74) *Attorney, Agent, or Firm* — Flynn Thiel, P.C.

(57) ABSTRACT

A semiconductor device in which an insulating material layer contains no reinforced fibers such as a glass cloth or a nonwoven cloth and which enables miniaturization of metal thin-film wiring layers, a reduction in the diameter of metal vias, and a reduction in interlayer thickness. The semiconductor device includes an insulating material layer including one or more semiconductor elements sealed with an insulating material containing no reinforced fibers, a plurality of metal thin-film wiring layers, metal vias that electrically connect the metal thin-film wiring layers together and electrodes of the semiconductor elements and the metal thin-film wiring layers together, and a warpage adjustment layer arranged on one principal surface of the insulating material layer to offset warpage of the insulating material layer to reduce warpage of the semiconductor device.

5 Claims, 11 Drawing Sheets

(51) Int. Cl.
*H01L 23/00* (2006.01)
*H01L 23/498* (2006.01)
*H01L 23/31* (2006.01)

(52) U.S. Cl.
CPC .......... *H01L 23/49838* (2013.01); *H01L 2224/04105* (2013.01); *H01L 2224/12105* (2013.01); *H01L 2224/18* (2013.01); *H01L 2224/32225* (2013.01); *H01L 2224/32245* (2013.01); *H01L 2224/73267* (2013.01); *H01L 2224/92244* (2013.01)

(58) Field of Classification Search
CPC ......... H01L 21/563; H01L 2224/32225; H01L 2224/73267; H01L 2224/04105; H01L 2224/12105; H01L 21/4845; H01L 21/481; H01L 21/4846; H01L 2224/32245
See application file for complete search history.

(56) References Cited

U.S. PATENT DOCUMENTS

| | | | | |
|---|---|---|---|---|
| 6,221,693 | B1 * | 4/2001 | Ho ..................... | H01L 21/4853 438/108 |
| 2004/0048978 | A1 * | 3/2004 | Okada ................. | C08F 283/04 524/606 |
| 2004/0195686 | A1 * | 10/2004 | Jobetto ................ | H01L 21/568 257/734 |
| 2004/0222510 | A1 * | 11/2004 | Aoyagi ............ | H01L 23/49816 257/686 |
| 2007/0145564 | A1 * | 6/2007 | Honer ................ | B81C 1/00301 257/690 |
| 2008/0145975 | A1 * | 6/2008 | Hsu ..................... | H01L 23/5389 438/123 |
| 2009/0002967 | A1 * | 1/2009 | Asami .................. | H01L 23/552 361/816 |
| 2009/0065245 | A1 * | 3/2009 | Hsu .................... | H01L 23/49822 174/260 |
| 2009/0134530 | A1 * | 5/2009 | Kurihara ........... | H01L 23/49833 257/784 |
| 2011/0149493 | A1 * | 6/2011 | Kwon .................. | H01L 21/561 361/679.02 |
| 2011/0284273 | A1 * | 11/2011 | Japp ..................... | H05K 3/4641 174/257 |
| 2013/0241087 | A1 * | 9/2013 | Shiobara ............... | H01L 23/293 257/791 |
| 2014/0291005 | A1 * | 10/2014 | Fukushima .......... | H05K 3/4602 174/262 |
| 2015/0016079 | A1 * | 1/2015 | Furutani ................ | H05K 1/185 361/763 |
| 2015/0034374 | A1 * | 2/2015 | Shimizu ................ | H05K 1/187 174/257 |
| 2015/0228416 | A1 * | 8/2015 | Hurwitz ................ | H01G 17/00 361/763 |
| 2016/0064329 | A1 * | 3/2016 | Lee ..................... | H01L 23/5389 257/659 |
| 2016/0369053 | A1 * | 12/2016 | Chiang ............. | C08G 73/1042 |

FOREIGN PATENT DOCUMENTS

| | | |
|---|---|---|
| JP | 2010-251688 A | 11/2010 |
| JP | 2014-125982 A | 7/2014 |
| JP | 2015-018979 A | 1/2015 |
| JP | 2015-028986 A | 2/2015 |

* cited by examiner

SEMICONDUCTOR DEVICE AND METHOD FOR MANUFACTURING SAME

BACKGROUND OF THE INVENTION

1. Field of the Invention

The present invention relates to a semiconductor device and a method of manufacturing the semiconductor device and, in particular, to a semiconductor device that has a Panel scale Fan-out package structure in which a thin film wiring step and an assembling step are performed on a large panel scale, and a method of manufacturing the semiconductor device.

2. Description of the Related Art

With a demand for the high functionality and the miniaturization of electronic equipment in recent years, electronic components have been increasingly integrated and mounted with a higher density. Thus, semiconductor devices used in the electronic equipment have been reduced in size more than ever before.

In certain types of semiconductor devices such as LSI units and IC modules, an integrated circuit chip 30 is buried in a thermosetting insulating resin layer 43 in openings in an inner-layer substrate 8 and a prepreg 40 as depicted in FIG. 8 (Japanese Patent Publication No. 2010-251688). However, in conventional types of semiconductor devices in which semiconductor elements are buried in an insulating material layer, a rigid composite material (hereinafter sometimes referred to as a "prepreg") formed by impregnating reinforced fibers with a thermosetting resin such as an epoxy and curing the resultant reinforced fibers is used for at least a part of an insulating material layer, in order to prevent possible warpage during a manufacturing process or possible warpage of products and achieve enhancement of the strength of the products.

However, when the prepreg is used as the interlayer insulating material, not only is the prepreg difficult to make thinner but metal vias and metal thin-film wires are difficult to miniaturize in view of machinability and quality. As a result, the insulating material layer needs to be formed in multiple layers, disadvantageously precluding the semiconductor devices from being reduced in size and thickness.

As depicted in FIG. 9, a semiconductor device described in Japanese Patent Publication No. 2010-219489 includes a support plate 1 formed of a resin cured member or metal. A semiconductor chip 2 is arranged on one principal surface of the support plate 1 with an element circuit surface (front surface) of the semiconductor chip 2 facing upward. A surface (back surface) of the semiconductor chip 2 opposite to the element circuit surface is secured to the support plate 1 with an adhesive 3. A single insulating material layer 4 is formed all over the principal surface of the support plate 1 so as to cover the element circuit surface of the semiconductor chip 2. On the single insulating material layer 4, a wiring layer 5 of a conductive metal such as copper is formed, and a conductive portion 6 is formed which electrically connects electrode pads of the semiconductor chip 2 to the wiring layer 5. The device contributes significantly to an increase in density of electronic components and a reduction in weight, thickness, and length of the electronic components, which have been increasingly demanded.

In this semiconductor device 20, the support plate 1 is a resin cured member formed by curing an insulating resin or flat plate formed of a metal such as stainless steel or a 42 alloy and having a uniform thickness. The support plate 1 is integrated into a semiconductor device. Thus, the semiconductor device as a final product is thick, making a further reduction in profile (a reduction in thickness) of the semiconductor device difficult.

SUMMARY OF THE INVENTION

1. Problems to be Solved by the Invention

An object of the present invention is to provide a semiconductor device in which an insulating material layer contains no reinforced fibers such as a glass cloth or a nonwoven cloth and which enables the miniaturization of metal thin-film wiring layers, a reduction in the diameter of metal vias, and a reduction in interlayer thickness.

2. Means for Solving the Problems

As a result of earnest studies, the inventors have completed the present invention by finding that, in a semiconductor device including an insulating material layer including one or more semiconductor elements sealed with an insulating material containing no reinforced fibers, a plurality of metal thin-film wiring layers, and metal vias that electrically connect the metal thin-film wiring layers together and electrodes of the semiconductor elements and the metal thin-film wiring layers together, warpage of the semiconductor device can be reduced by arranging a warpage adjustment layer on one principal surface of the insulating material layer to allow warpage of the insulating material layer to be offset by warpage of the warpage adjustment layer.

That is, the present invention is as described below.

(1) A semiconductor device including:

an insulating material layer including one or more semiconductor elements sealed with an insulating material containing no reinforced fibers, a plurality of metal thin-film wiring layers, and metal vias that electrically connect the metal thin-film wiring layers together and electrodes of the semiconductor elements and the metal thin-film wiring layers together; and a warpage adjustment layer arranged on one principal surface of the insulating material layer to offset warpage of the insulating material layer to reduce warpage of the semiconductor device.

(2) The semiconductor device recited in (1), in which the semiconductor elements are mounted, via an adhesive, on a back side of the surface of the insulating material layer on which an external terminal is mounted, the semiconductor elements being mounted such that element circuit surfaces of the semiconductor elements face upward.

(3) The semiconductor device recited in (1) or (2), in which the warpage adjustment layer is a layer made of an insulating resin.

(4) The semiconductor device recited in (1) or (2), in which the warpage adjustment layer is formed of one or more electronic components mounted on internal electrodes provided in an outermost layer of the insulating material layer, and an insulating resin that seals the electronic components.

(5) The semiconductor device recited in (4), in which a gap formed between the insulating material layer and the electronic components is filled with the insulating resin sealing the electronic components.

(6) The semiconductor device recited in any one of (1) to (5), in which a thermal-expansion coefficient ($\alpha 1$) of the insulating resin is 0.8 to 1.5 times a thermal-expansion coefficient ($\alpha 1$) of an interlayer insulating material for the insulating material layer at 30 ppm/° C. or less, and the insulating resin and the interlayer insulating material have a glass transition point (DMA method) of 150° C. or higher.

(7) The semiconductor device recited in (4) or (5), in which the electrodes of the semiconductor elements lie opposite to a mounting surface for the electronic components.

(8) The semiconductor device recited in any one of (1) to (7), in which the number of insulating material layers above and below the semiconductor elements are each one or more.

(9) The semiconductor device recited in any one of (1) to (8), in which one of the semiconductor elements is mounted on any layer surface.

(10) The semiconductor device recited in any one of (1) to (8), in which a plurality of the semiconductor elements are mounted on any identical layer surface or on any different layer surfaces or using a combination thereof.

(11) The semiconductor device recited in any one of (1) to (10), in which side surfaces of conductors of the external electrodes and of the metal thin-film wiring layer on the same surface are buried in the insulating material layer.

(12) A method for manufacturing the semiconductor device recited in (1), the method including:

a step of forming a metal thin-film wiring layer including external electrodes on a front surface of a support plate;

a step of laminating a first interlayer insulating material containing no reinforced fibers on the metal thin-film wiring layer including the external electrodes to form a first insulating material layer;

a step of mounting semiconductor elements on the first insulating material layer via an adhesive such that element circuit surfaces having electrodes face upward;

a step of sealing the semiconductor elements and peripheries thereof with a second interlayer insulating material containing no reinforced fibers;

a step of forming, in the second interlayer insulating material, metal via holes that reach the metal thin-film wiring layer including the external electrodes and the electrodes of the semiconductor elements;

a step of forming a metal thin-film wiring layer and metal vias on the second interlayer insulating material;

a step of forming a second insulating material layer by repeating steps of forming the second interlayer insulating material, forming the holes, and forming the metal thin-film wiring layer and the metal vias;

a step of forming a warpage adjustment layer made of an insulating resin, on the second insulating material layer; and a step of peeling off the support plate from the first insulating material layer to expose a surface of the metal thin-film wiring layer including the external electrodes, the warpage adjustment layer having a physical property of offsetting warpage of the first insulating material layer and the second insulating material layer to reduce warpage of the semiconductor device.

(13) A method for manufacturing the semiconductor device recited in (4), the method including:

a step of forming a metal thin-film wiring layer including external electrodes on a front surface of a support plate;

a step of laminating a first interlayer insulating material containing no reinforced fibers on the metal thin-film wiring layer including the external electrodes to form a first insulating material layer;

a step of mounting semiconductor elements on the first insulating material layer via an adhesive such that element circuit surfaces having electrodes face upward;

a step of sealing the semiconductor elements and peripheries thereof with a second interlayer insulating material containing no reinforced fibers;

a step of forming, in the second interlayer insulating material, metal via holes that reach the metal thin-film wiring layer including the external electrodes and the electrodes of the semiconductor elements;

a step of forming a metal thin-film wiring layer and metal vias on the second interlayer insulating material;

a step of forming a second insulating material layer by repeating steps of forming the second interlayer insulating material, forming the holes, and forming the metal thin-film wiring layer and the metal vias;

a step of forming a solder resist layer on the second insulating material layer and mounting electronic components;

a step of sealing the electronic components with an insulating resin to form a warpage adjustment layer; and a step of peeling off the support plate from the first insulating material layer to expose a front surface of the metal thin-film wiring layer including the external electrodes, the warpage adjustment layer having a physical property of offsetting warpage of the first insulating material layer and the second insulating material layer to reduce warpage of the semiconductor device.

The semiconductor device in the present invention can exert the following effects.

The insulating material layer contains no reinforced fibers, enabling miniaturization of the metal thin-film wiring layer and a reduction in the diameter of the metal vias and in interlayer thickness. The resultant high-density wiring and a resultant reduction in the number of layers in turn enable a reduction in the size and thickness of the semiconductor device.

The semiconductor device has no support plate or prepreg but has the warpage adjustment layer, suppressing possible warpage.

Wiring lengths between the semiconductor elements and the electronic components can be minimized, allowing electrical characteristics to be enhanced.

The semiconductor elements can be mounted on the surfaces of any number of layers, increasing the degree of freedom of wiring design and enabling a design balanced with a residual copper rate or the like as a warpage measure.

Since the side surfaces of the external electrodes are buried in the insulating material layer, the external electrodes have an increased adhesion strength, enhancing the impact resistance and secondary-mounting reliability. This allows the avoidance of a possible short circuit between adjacent external terminals caused by excessive plating applied to the external electrodes during surface treatment.

DETAILED DESCRIPTION OF THE PREFERRED EMBODIMENTS

Figure 1:
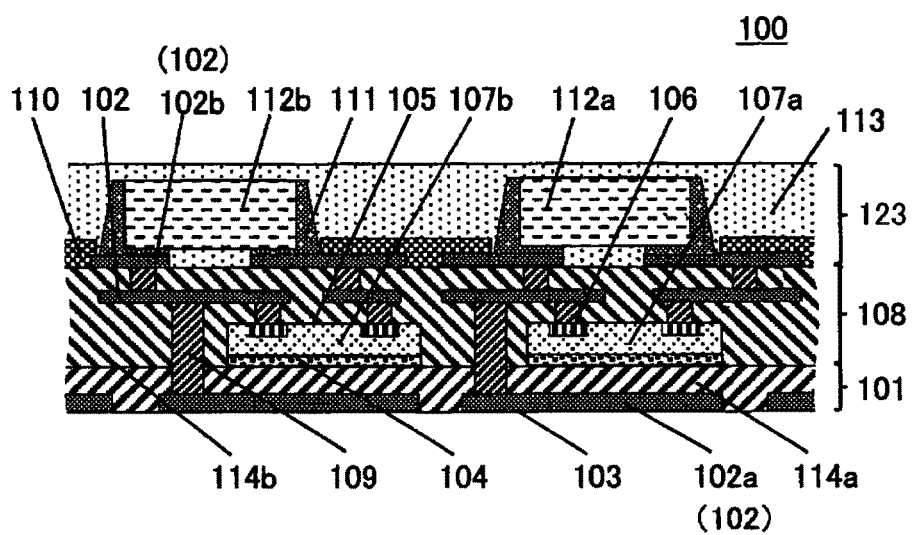
FIG. 1 is a diagram depicting a semiconductor device in a first embodiment of the present invention.

A form in which the present invention is implemented will be described. Embodiments will be described below based on the drawings. However, the drawings are provided for illustration and the present invention is not limited to the drawings.

As described above, the conventional semiconductor device has a rigid prepreg in an insulating material layer including semiconductor elements or a rigid support plate laminated therein in order to achieve, for example, the prevention of warpage. In contrast, the semiconductor device in the present invention is characterized by preventing the warpage of the semiconductor device without any reinforced material in an insulating material layer including semiconductor elements and without any support member.

Means for preventing the warpage of the semiconductor device in the present invention will be described below in detail.

The semiconductor device in the present invention has one or more semiconductor elements sealed in an insulating material layer containing no reinforced fibers such as a glass cloth or a nonwoven cloth, and includes a metal thin-film wiring layer associated with the insulating material layer and metal vias electrically connecting any metal thin-film wiring layers together and electrodes of the semiconductor elements and the metal thin-film wiring layers together. The term "metal thin-film wiring layer" is a general term for conductor patterns obtained in a circuit formation process (except for metal vias) and includes all of signal circuits, solid patterns for a power supply/ground, electrodes, and the like.

The insulating material layer exhibits a given warpage depending on the type of an insulating material forming the insulating material layer, the arrangement of the semiconductor elements, the volume occupied by the semiconductor device, the area ratio of a copper foil portion (residual copper rate), and the like.

Thus, in the present invention, on one principal surface of the insulating material layer, a layer (hereinafter referred to as a "warpage adjustment layer") warped in a direction opposite to a direction in which the insulating material layer is warped is arranged to offset the warpage of the insulating material layer, thus reducing the warpage of the semiconductor device.

The warpage adjustment layer is a layer that is warped as a result of a mismatch between the insulating material layer and the warpage adjustment layer in terms of a thermal-expansion efficient. The warpage adjustment layer may be a layer formed of a single material or a layer containing electronic components.

Specifically, the warpage adjustment layer is preferably a layer of an insulating resin or a layer including one or more electronic components and an insulating resin that seals the one or more electronic components.

The warpage of the semiconductor device is determined by the warpage of the insulating material layer and the warpage of the warpage adjustment layer. Thus, for example, when a layer of a particular insulating resin is selected as the warpage adjustment layer, the warpage of the insulating material layer may be adjusted so as to reduce the warpage of the semiconductor device by designing the type of the insulating material forming the insulating material layer, the arrangement of the semiconductor elements, the volume fraction of the semiconductor element device, the area ratio of the copper foil portion (residual copper rate), and the like.

When a layer including electronic components and an insulating resin is used as the warpage adjustment layer, the type of the insulating resin, the arrangement and volume fraction of the electronic components, and the like may be designed so that the warpage of the insulating material layer is offset.

Furthermore, both the insulating material layer and the warpage adjustment layer respectively may be designed to allow the warpage of the insulating material layer and the warpage of the warpage adjustment layer to offset each other.

The semiconductor device in the present invention includes no support plate. For recent LSIs, forming, as internally mounted elements, passive elements such as resistors, capacitors, and inductors has been more important in addition to active elements such as MOS transistors and bipolar transistors.

Figure 10:
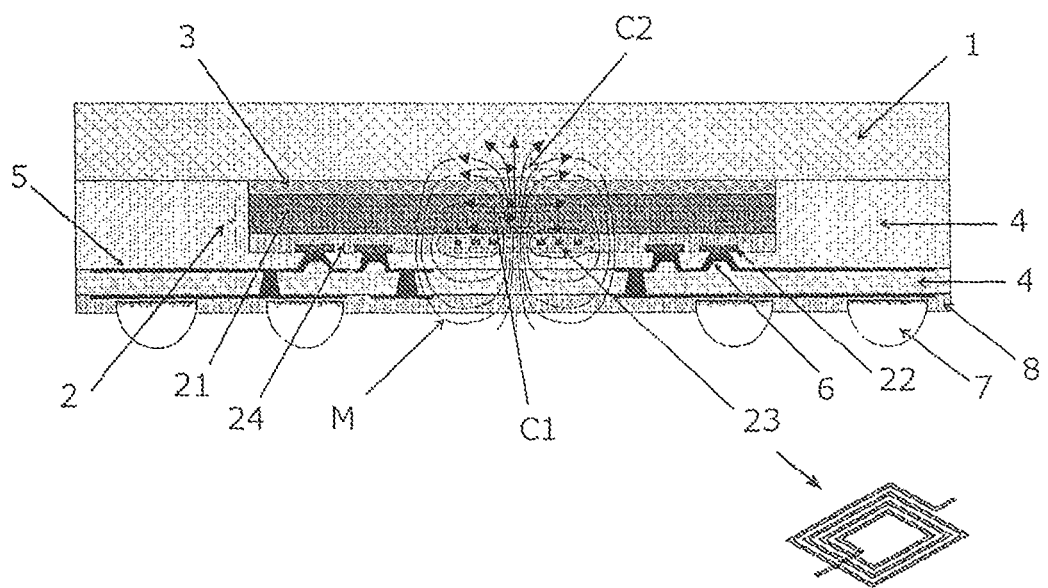
FIG. 10 is a diagram illustrating effects of a magnetic flux generated by an RF circuit in the conventional semiconductor device.

When a semiconductor device is activated, a current flows in an inductor 23 as shown in FIG. 10.

When a current flows in the inductor 23, a magnetic flux (magnetic field) M is generated as shown in an arrow in the figure.

When the generated magnetic flux M enters the Si substrate 21, a first eddy current C1 is generated in the Si substrate 21 as shown by the arrows since Si is a semiconductor, and a first power loss occurs.

Moreover, a magnetic flux M is generated also in the metal flat plate 1, so that a second eddy current C2 is generated, and a second power loss occurs.

As the semiconductor chip 2 is thin, the metal flat plate 1 is close to the inductor 23, an eddy current is prone to be generated in the metal flat plate 1, and a power loss is increased. In the semiconductor device having a Panel scale Fan-out package structure in which the thin film wiring step and the assembling step are performed on a large panel scale, the thickness of the semiconductor chip 2 is 50 μm, which is thin, and thus, an eddy current is prone to be generated.

As described above, by the magnetic flux M generated by the inductor 23, eddy currents C1 and C2 are generated in the Si substrate 21 and the metal flat plate 1, a power loss is increased, and the Q value showing the characteristics of the inductor is reduced compared with the semiconductor device using no metal flat plate as a support.

The Q value is a performance index of an inductor, and shows the extent of power loss generated in the inductor. A larger Q value means a smaller power loss of the inductor, and therefore the inductor has a higher performance. The increase in Q value is really important for improving the performance of the integrated circuit (RFIC) processing a high-frequency signal. In a device such as a mobile phone that specifically requires low power consumption, the power consumption can be significantly reduced by slightly improving the Q value of the inductor, and thus, a high-performance inductor having a high Q value is required.

First Embodiment

FIG. 1 depicts a structural sectional view of a semiconductor device 100 according to a first embodiment of the present invention.

The semiconductor device 100 has a first insulating material layer 101 on one side of the semiconductor device 100.

The first insulating material layer 101 is provided with external electrodes 102a. Semiconductor elements 107a and 107b are mounted via an adhesive 104 on the back side of a mounting surface 103 of the first insulating material layer 101 on which the external electrodes 102a are mounted, the semiconductor elements 107a and 107b being mounted such that an element circuit surface 105 and electrodes 106 arranged in the element circuit surface 105 face upward.

The semiconductor elements 107a and 107b and a periphery thereof are sealed by a second insulating material layer 108.

A metal thin-film wiring layer 102 formed of copper or a copper alloy is provided on and/or in the first insulating material layer 101 and the second insulating material layer 108.

Metal vias 109 electrically connect any wiring layers of the metal thin-film wiring layer 102 together and the metal thin-film wiring layer 102 and the electrodes 106 of the semiconductor elements 107a and 107b together.

A solder resist layer 110 and internal electrodes 102b are provided on the second insulating material layer 108. Electronic components 112a and 112b are mounted on the respective internal electrodes 102b via solder materials 111. The electronic components 112a and 112b are sealed with an insulating resin 113.

Electric connections are established among the metal thin-film wiring layer 102, the external electrodes 102a provided in the first insulating material layer 101, the electrodes 106 in the semiconductor elements 107a and 107b, the metal vias 109, the internal electrodes 102b provided on the second insulating material layer 108, and the electronic components 112a and 112b mounted on the internal electrodes 102b.

The first insulating material layer 101 is formed as a single-side single-layer substrate including the metal thin-film wiring layer 102 with the external electrodes 102a on one side of a first interlayer insulating material 114a. As the first interlayer insulating material 114a, a thermosetting resin is used which contains no reinforced fibers such as a glass cloth or a nonwoven cloth. This enables miniaturization of the associated metal thin-film wiring layer 102 and a reduction in the diameter of the metal vias 109 and in interlayer thickness. The resultant high-density wiring and a resultant reduction in the number of layers in turn enable a reduction in the size and thickness of the semiconductor device.

Figure 2:
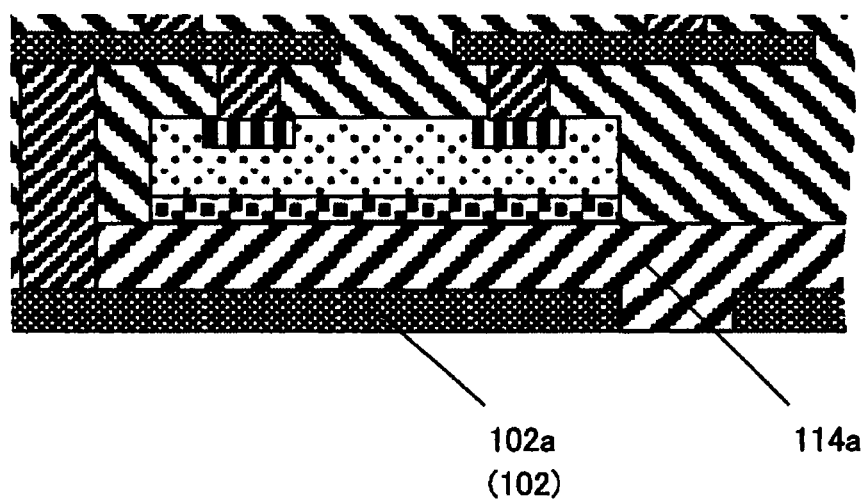
FIG. 2 is a diagram depicting a section of external electrodes in the semiconductor device depicted in FIG. 1.

Conductor side surfaces of the external electrodes 102a and of the metal thin-film wiring layer 102 on the same layer surface are completely buried in the first insulating material layer 101 as depicted in FIG. 2. This increases the contact area of the conductors and thus the adhesion strength of the external electrodes 102a, enhancing the impact resistance and secondary-mounting reliability. Furthermore, when electroless nickel-gold plating or the like is applied to the external electrodes 102a as a surface treatment, the possibility of a short circuit caused by excessively thick plating can be reduced.

The first insulating material layer 101 is not limited to the single-sided single-layer substrate but may be a metal single-layer substrate, a double-sided substrate, or a multilayer substrate in order to optimize the wiring design or structural design. When a metal single-layer substrate or a double-sided substrate is used instead of the first insulating material layer 101, the semiconductor elements 107a and 107b are mounted on the metal thin-film wiring layer 102 via the adhesive 104. Even when a multilayer substrate is used, the configuration is not limited to mounting on the first interlayer insulating material 114a but the semiconductor elements 107a and 107b may be mounted on the metal thin-film wiring layer 102 via the adhesive 104. At this time, the use of a material with a high heat conductivity as the adhesive 104 enables a heat radiation design of the semiconductor device 100 to be facilitated.

A higher heat radiation effect is exerted by installing copper solid patterns on the same layer surfaces as those of the external electrodes 102a and connecting the copper solid patterns to the electrodes 106 of the semiconductor elements 107a and 107b via the metal thin-film wiring layer 102 and the metal vias 109. The semiconductor elements 107a and 107b are arranged such that the electrodes 106 thereof lie opposite to a mounting surface for the electronic components 112a and 112b. Thus, the semiconductor elements 107a and 107b can be connected to the electronic components 112a and 112b with the shortest distance, allowing the electrical characteristics to be enhanced.

Like the first insulating material layer 101, the second insulating material layer 108, which seals the semiconductor elements 107a and 107b, includes a second interlayer insulating material 114b formed of a thermosetting resin containing no reinforced fibers such as a glass cloth or a nonwoven cloth and the metal thin-film wiring layer 102. Multiple layers in the second insulating material layer 108 are formed by sequentially laminating the second interlayer insulating material 114b and the metal thin-film wiring layer 102. As described above, the number of the first insulating material layers 101 can be freely changed, and the sequential lamination is performed for the second insulating material layer 108. Thus, any number of semiconductor elements can be mounted on any one or more layer surfaces. Consequently, the semiconductor elements can be mounted on the surfaces of any number of layers, increasing the degree of freedom of wiring design and enabling a design balanced with a residual copper rate or the like as a warpage measure.

In FIG. 1 in the present embodiment, the solder resist layer 110 is formed only on the side of the internal electrodes 102b in the second insulating material layer 108. However, the present invention is not limited to this. The solder resist layer 110 may be formed also on the side of the metal thin-film wiring layer 102 in the first insulating material layer 101, which includes the external electrodes 102a. The external electrodes 102a may be formed to have an SMD (Solder Mask Defined) structure, enabling a further increase in the adhesion strength of the external electrodes 102a. When BGA balls are mounted, sidewalls of the solder resist layer 110 serve as support members to allow the BGA balls to be prevented from missing.

The electronic components 112a and 112b are members included in the warpage adjustment layer 123 and are intended to suppress the initial warpage of flowing products and finished products during a manufacturing process and warpage during the actual use of the products. For convenience, FIG. 1 depicts a form in which two electronic components of the same type are mounted by soldering. Thus, the number of components and the types of the components are determined so as to set the rate of the electronic components in the mounting surface to 25% or more. Different electronic components may be mixed together regardless of whether they are passive components, active components, mechanical components, or the like. Furthermore, a mounting method may be gold-gold ultrasonic junction, gold bump pressure contact, conductive-particle pressure bonding, conductive-adhesive bonding, or the like.

The insulating resin 113 sealing the electronic components 112a and 112b is a member forming the warpage adjustment layer 123 and is intended to suppress the initial warpage of flowing products and finished products during the manufacturing process and warpage during the actual use of the products. The insulating resin 113 may be a thermosetting resin or a photo-developing photocurable+ thermosetting resin, or may be a sealing resin for semiconductors or for example, an interlayer insulating material sheet or a solder resist material that is an insulating material for printed circuit boards. A thermal-expansion coefficient ($\alpha 1$) of the insulating resin 113 is adjusted to 0.8 to 1.5 times a thermal-expansion coefficient ($\alpha 1$) of the first interlayer insulating material 114a and the second interlayer insulating material 114b at 30 ppm/° C. or less.

The inventors have found that, in the semiconductor device structure in the present invention, for the thermal-expansion coefficient ($\alpha 1$) for the interlayer insulating material needed to maintain connection reliability of the metal vias and design regions for the thermal-expansion coefficient ($\alpha 1$) for the metal thin-film wiring layer formed of copper or a copper alloy and the residual copper rate of the metal thin-film wiring layer, a warpage adjustment range based on the thermal-expansion coefficient ($\alpha 1$) for the insulating resin 113 is 0.8 to 1.5 times the thermal-expansion coefficient ($\alpha 1$) for the interlayer insulating material. The first interlayer insulating material 114a is equivalent in thermal-expansion coefficient ($\alpha 1$) to the second interlayer insulating material 114b.

A glass transition point (DMA) is 150° C. or higher for all the materials. The insulating resin 113 has a modulus of elasticity (RT) of 35 GPa or less. This enables the minimization of the initial warpage of flowing products and finished products during the manufacturing process and warpage during the actual use of the products. To maintain the reliability for a long time, the gap between the second insulating material layer 108 and the electronic components 112a and 112b is reliably filled with the insulating resin 113 as depicted in FIG. 1. Instead of being completely buried in the insulating resin 113 as depicted, the electronic components 112a and 112b may be arranged such that the approximately upper one-third of each of the electronic components 112a and 112b is exposed. This enables a contribution to a reduction in the thickness of the semiconductor device.

By way of example, details of product specifications for the semiconductor device in the first embodiment depicted in FIG. 1 are as follows.

Figure 3A:
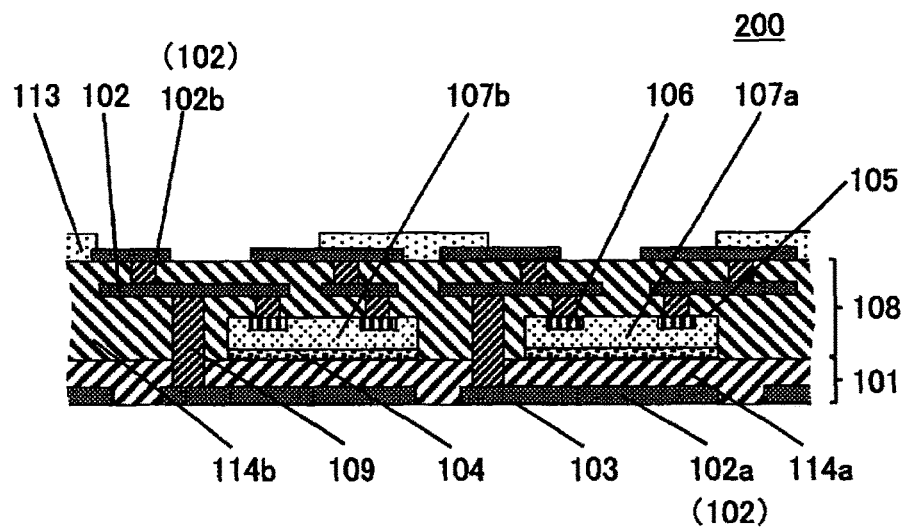
FIG. 3A is a diagram depicting a semiconductor device in a second embodiment of the present invention.

Product size (semiconductor device 100): 5 mm×5 mm
Semiconductor elements (107a and 107b)
    Size: 2 mm×2 mm
    Thickness: 50 μm (the semiconductor elements 107a and 107b are the same in size)
Metal thin-film wiring layer (102, 102a, and 102b)
    Thickness: 15 μm (common to all the layers)
    Residual copper rate: 65 to 95% (common to all the layers)
Interlayer insulating materials (114a and 114b)
    Material: epoxy-based resin
    Physical property value: glass transition point (DMA) 172° C.
    Thermal-expansion coefficient ($\alpha 1$): 23 ppm/° C.
    Interlayer thickness: 20 μm (the same specification for all of metal thin-film wiring layer-metal thin-film wiring layer, metal thin-film wiring layer-semiconductor element bottom surface, and semiconductor element top surface-metal thin-film wiring layer)
Solder resist layer (110)
    Thickness: 20 μm
Insulating resin (113)
    Material: epoxy-based resin
    Physical property value: glass transition point (DMA) 185° C.
    Thermal-expansion coefficient ($\alpha 1$): 28 ppm/° C.
    Thickness: 350 μm Second Embodiment FIG. 3A is a structural sectional view of a semiconductor device 200 according to a second embodiment of the present invention.

Figure 3B:
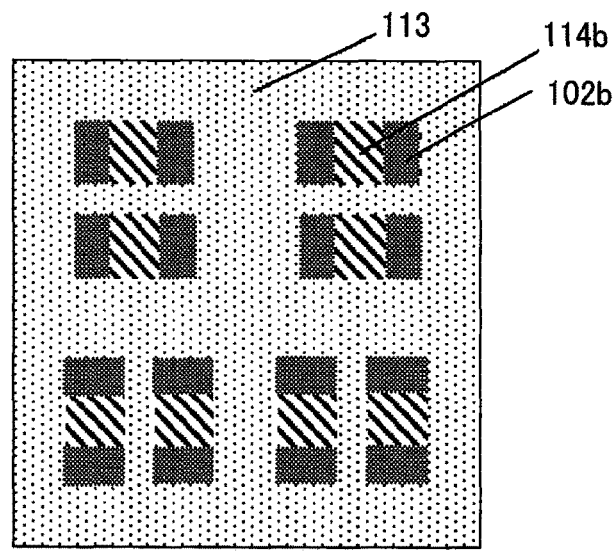
FIG. 3B is a diagram depicting the semiconductor device in the second embodiment of the present invention.

In the first embodiment, both the insulating resin 113 and the electronic components 112a and 112b are provided with the function of the warpage adjustment layer 123. However, the insulating resin 113 maybe exclusively provided with the function. FIG. 3B is a plan view of the semiconductor device 200 according to the second embodiment of the present invention. FIG. 3B illustrates that peripheral portions of the internal electrodes 102b and the second interlayer insulating materials 114b are covered with the insulating resin 113.

When the insulating resin 113 is exclusively used as the warpage adjustment layer 123, the solder resist layer 110 may be omitted and the insulating resin 113 may be provided with the function of the solder resist layer 110. Hence, a solder resist material may be applied to the insulating resin 113. Given the easiness with which resin components can be designed to, for example, provide desired physical property values, a thermosetting resin, which needs no photo-curing mechanism, is preferably applied. For the thermosetting resin, a desired solder resist pattern can be formed, for example, by curing the resin and then performing, on the resin, laser direct drawing, laser ablation using a copper film as a mask, blasting or etching using permanganate solution using a copper film or a dry film as a mask, or the like. In the semiconductor device structure, functions of the external electrode 102a and the internal electrode 102b are not restricted, and may be interchanged with one another. Thus, structural specifications for the semiconductor device can be made compatible with customers' packaging configurations such as the presence or absence of the electronic components 112a and 112b, a PoP (Package on Package) structure, or a SiP (System in Package) structure.

Third Embodiment

Figure 4:
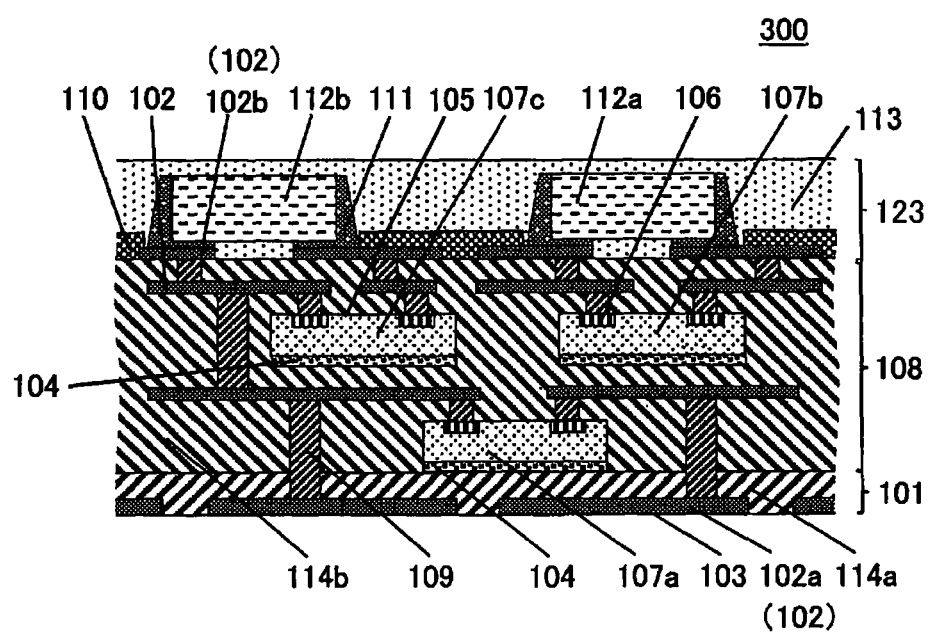
FIG. 4 is a diagram depicting a semiconductor device in a third embodiment of the present invention.

FIG. 4 is a structural sectional view of a semiconductor device 300 in a third embodiment of the present invention. The semiconductor element 107a is mounted on the first insulating material layer 101 via the adhesive 104. The semiconductor elements 107a and 107b are mounted on the second insulating material layer 108 via the adhesive 104. In the present embodiment, any number of semiconductor elements are mounted on any one or more layer surfaces as described above.

FIGS. 5A to 5J are process sectional views illustrating a method for manufacturing the semiconductor device according to the first embodiment of the present invention. FIGS. 5A to 5J depict one of product units attached to a panel by step and repeat imposition.

Figure 5A:
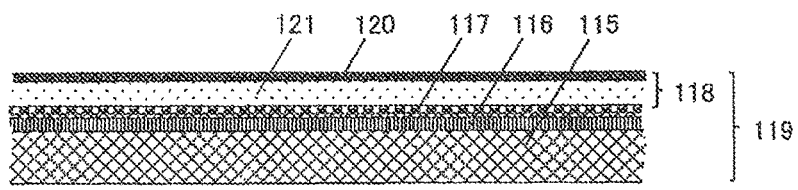
FIG. 5A to 5F is a diagram illustrating a process for manufacturing a semiconductor device in the first embodiment of the present invention.

As depicted in FIG. 5A, a very thin copper foil with a copper foil carrier 118 including a copper foil carrier 121 and a very thin copper foil 120 is stuck to a surface of a flat plate 115 via a stress relaxation layer 116 and a bonding layer 117 to form a support plate 119. The support plate 119 makes the panel rigid and serves to prevent warpage during the flow of the manufacturing process.

The stress relaxation layer will be described.

In general, metals and resins are significantly different in thermal-expansion coefficients. Thus, in a process of manufacturing a semiconductor package including a metal substrate as the flat plate, internal stress results from the difference in thermal-expansion coefficients between the metal substrate and the resin sealing the semiconductor elements. The sealing member is then warped.

A role of the stress relaxation layer 116 is to reduce the internal stress resulting from a difference in physical property value between the flat plate 115 and the first interlayer insulating material 114a (stress exerted at an interface between the flat plate 115 and the first interlayer insulating material 114a). Thus, as the stress relaxation layer 116, an insulating layer is desirably used which has a modulus of elasticity smaller than the moduli of elasticity of the flat plate 115 and the first interlayer insulating material 114a.

The stress relaxation layer 116 forms a part of the support plate 119 and is stripped from the first interlayer insulating material 114a during the manufacturing process. Therefore, the stress relaxation layer suppresses the warpage of the semiconductor device during the manufacturing process. After the support plate 119 is stripped, the role of suppressing the warpage of the semiconductor device is handed over to the warpage adjustment layer 123.

Specifically, when, under the same temperature condition, the flat plate 115 is assumed to have a modulus of elasticity A, the stress relaxation layer 116 is assumed to have a modulus of elasticity B, and the first interlayer insulating material 114a is assumed to have a modulus of elasticity C, a combination of the flat plate 115, the stress relaxation layer 116, and the first interlayer insulating material 114a may be determined such that $A>C>B$ or $C>A>B$.

In this manner, the stress relaxation layer 116 desirably has a low elasticity. For example, the stress relaxation layer 116 desirably has a modulus of elasticity of, for example, 2 GPa or less in a temperature region of approximately 25° C. (room temperature) and 100 MPa or less in a temperature region of higher than 100° C. The upper limits are placed on the modulus of elasticity in the respective temperature regions because, when the upper limit values are exceeded, the stress relaxation layer 116 is excessively hard to degrade the function of the stress relaxation layer.

That is, at room temperature, the function of the stress relaxation layer is sufficiently effective even when the stress relaxation layer is hard to some degree (even when the modulus of elasticity is high to some degree). Thus, the modulus of elasticity of the stress relaxation layer 116 may be at least 2 GPa or less. On the other hand, in a temperature region of higher than 100° C. such as a temperature region near a curing temperature of thermosetting resins (approximately 170° C.) (desirably a temperature region of higher than 150° C.), the modulus of elasticity of the stress relaxation layer 116 is 100 MPa or less. When the modulus of elasticity is higher than 100 MPa in such a high temperature region, the function of the stress relaxation layer may be ineffective.

The effectiveness of the function of the stress relaxation layer increases with a decreasing modulus of elasticity. However, an excessively low modulus of elasticity results in an extremely high fluidity, precluding the shape of the layer from being maintained. Therefore, the modulus of elasticity needs to fall within a range in which the shape of the layer can be maintained within a temperature range from the room temperature to 260° C. (reflow temperature).

If an insulating layer that meets the above-described relation of the modulus of elasticity is used as the stress relaxation layer 116, $a \leq c < b$ (or $a \cong c < b$) is established when, under the same temperature condition, the flat plate 115 is assumed to have a linear expansion coefficient a, the stress relaxation layer 116 is assumed to have a linear expansion coefficient b, and the first interlayer insulating material 114a is assumed to have a linear expansion coefficient c.

In general, the linear expansion coefficient of the metal substrate is approximately 20 ppm/° C., and the linear expansion coefficient of the first interlayer insulating material 114a is approximately several tens of ppm/° C. Thus, for the semiconductor device according to the present embodiment, an insulating layer is used which has a linear expansion coefficient of 100 to 200 ppm/° C. and desirably 100 to 150 ppm/° C. in a temperature region of 200° C. or lower. The condition of the temperature region of 200° C. or lower is set because an upper limit temperature during the process for manufacturing semiconductor devices is approximately 200° C. The condition of the temperature region of 200° C. or lower means that the linear expansion coefficient desirably falls within the above-described range at least during the process for manufacturing semiconductor devices.

Moreover, as the stress relaxation layer 116 in the semiconductor device according to the embodiments of the present invention, an adhesive is desirably used which has a 5% mass reduction temperature of 300° C. or higher. This condition is set in order to prevent reliability of the semiconductor device from being degraded by using an insulating layer, the mass of which is unlikely to be reduced even through a reflow process (that is, a reflow-resistant insulating layer), because a general reflow temperature is approximately 260° C.

The "mass reduction temperature," which is an index used to indicate the heat resistance of a substance, is the temperature at which a given mass reduction occurs when a slight amount of substance is heated from the room temperature while a nitrogen gas or air is made to flow. The "mass reduction temperature" herein is the temperature at which a 5% mass reduction occurs.

Moreover, as the stress relaxation layer 116, a resin is desirably used which exhibits an adhesion classified into "category 0" in the JIS cross-cut tape test (former JISK5400)

both for the flat plate (a substrate formed of a typical metal material such as an iron alloy or a copper alloy) 115 and for the first interlayer insulating material 114a (an epoxy-based resin, a phenol-based resin, or a polyimide-based resin). Consequently, the adhesion between the flat plate 115 and the first interlayer insulating material 114a can be enhanced, allowing peel-off of the first interlayer insulating material 114a to be suppressed.

As described above, the stress relaxation layer 116 preferably satisfies at least one (desirably, all) of the following. (1) When, under the same temperature condition, the flat plate 115 is assumed to have a modulus of elasticity A, the stress relaxation layer 116 is assumed to have a modulus of elasticity B, and the first insulating material layer 101 and the second insulating material layer 108 assumed to have a modulus of elasticity C, A>C>B or C>A>B. (2) When, under the same temperature condition, the flat plate 115 is assumed to have a linear expansion coefficient a, the stress relaxation layer 116 is assumed to have a linear expansion coefficient b, and the first insulating material layer 101 and the second insulating material layer 108 are assumed to have a linear expansion coefficient c, a≤c<b (or a≅c<b).

This enables a reduction in internal stress resulting from a difference in physical property value between the flat plate 115 and the first interlayer insulating material 114a, allowing the possibility of warpage of the flat plate 115 and the first interlayer insulating material 114a to be minimized.

For the stress relaxation layer 116, see Japanese Patent Application No. 2014-125982 (semiconductor package and method for manufacturing the same).

The flat plate 115 may be a resin cured member or a metal plate such as stainless steel, a 42 alloy, copper, or a copper alloy. As the size of the flat plate 115, the work size of a printed circuit board may be applied, for example, 400 mm×500 mm or 500 mm×600 mm. Compared to conventional wafer level packaging, the flow of a large panel through the manufacturing process increases the production efficiency and enables a cost reduction. The vertical orientation of the very thin copper foil with the copper foil carrier 118 is such that a very thin copper foil 120 of 1.5 μm to 5 μm thickness faces the product. The very thin copper foil with the copper foil carrier 118 may be a commercially-available very-thin copper foil with a copper foil carrier that is widely used for the formation of an MSAP (Modified Semi Additive Process) circuit on a printed circuit board or for manufacture of a coreless substrate.

Figure 6:
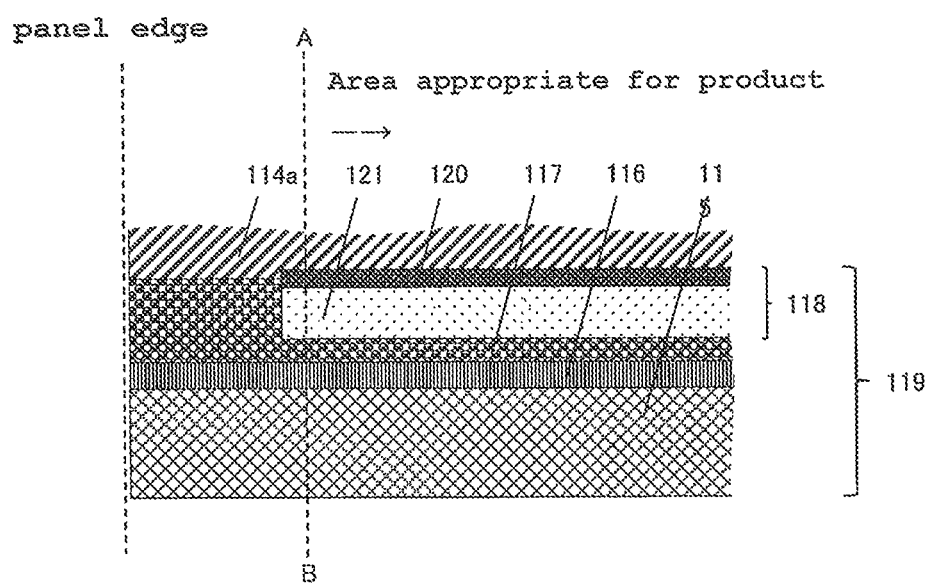
FIG. 6 is a panel sectional view illustrating an example of a preventive measure against peel-off of a very thin copper foil with a copper foil carrier during the process for manufacturing a semiconductor device in FIGS. 5A to 5J.

To prevent the very thin copper foil with the copper foil carrier 118 from being peeled off during the flow through the manufacturing process, the very thin copper foil with the copper foil carrier 118 may be set smaller in size than the flat plate 115, the bonding layer 117, and the first interlayer insulating material 114a such that boundary ends of the copper foil carrier 121 and the very thin copper foil 120 can be covered and protected by the bonding layer 117 and the first interlayer insulating material 114a, as depicted in FIG. 6.

Figure 5B:
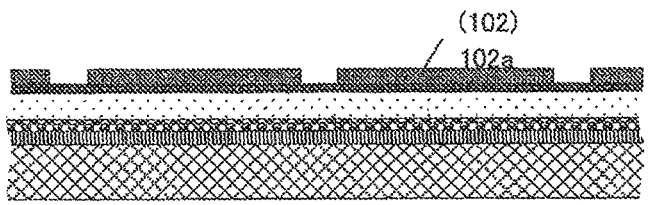
Figure 5C:
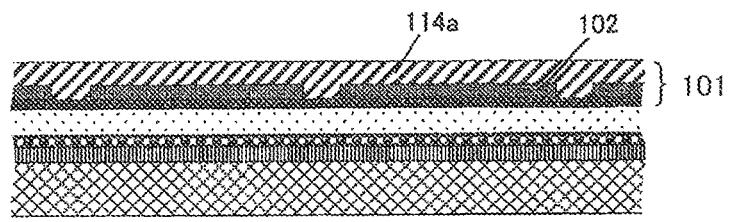
Figure 5D:
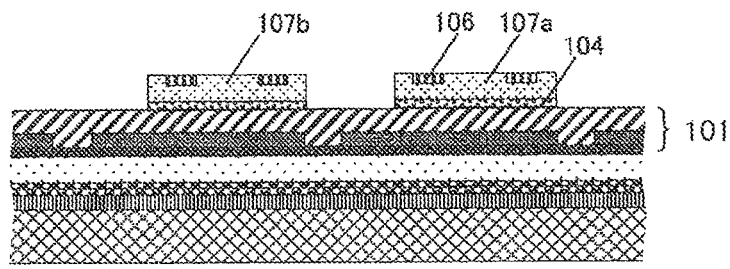
Figure 5E:
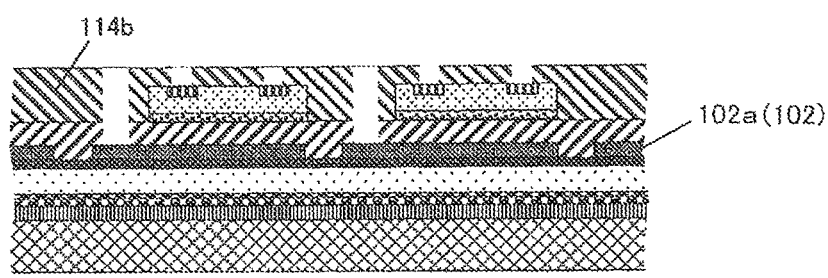
Figure 5F:
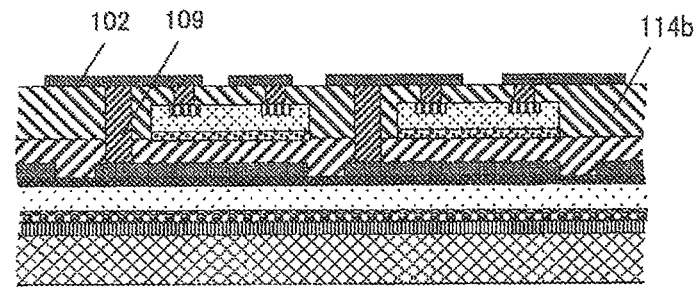
Figure 5G:
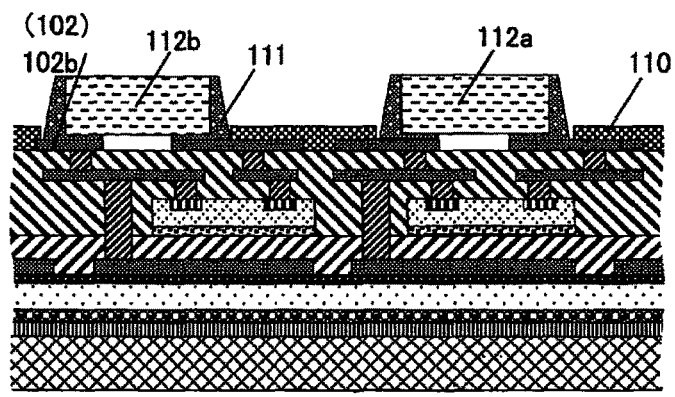
FIG. 5G to 5J is a diagram illustrating the process for manufacturing a semiconductor device in the first embodiment of the present invention.
Figure 5H:
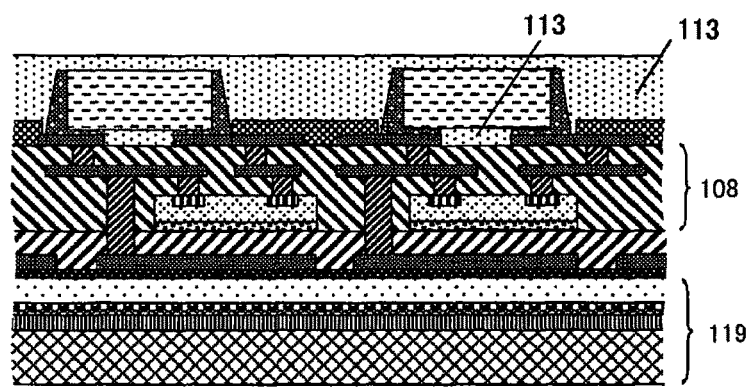
Figure 5I:
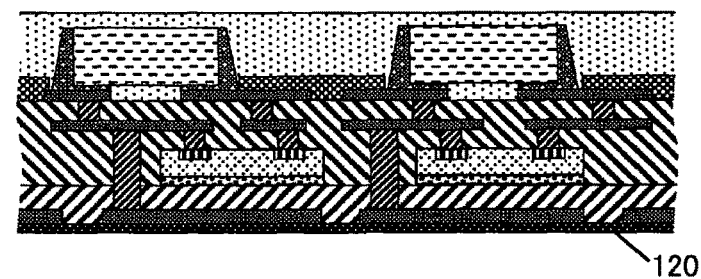

As depicted in FIG. 5I described below, the support plate 119 is stripped from the product. The very thin copper foil with the copper foil carrier 118 including the copper foil carrier 121 and the very thin copper foil 120 is a member forming the support plate 119, but the very thin copper foil 120 is left on the product when the support plate 119 is stripped, and is then etched away.

Figure 7:
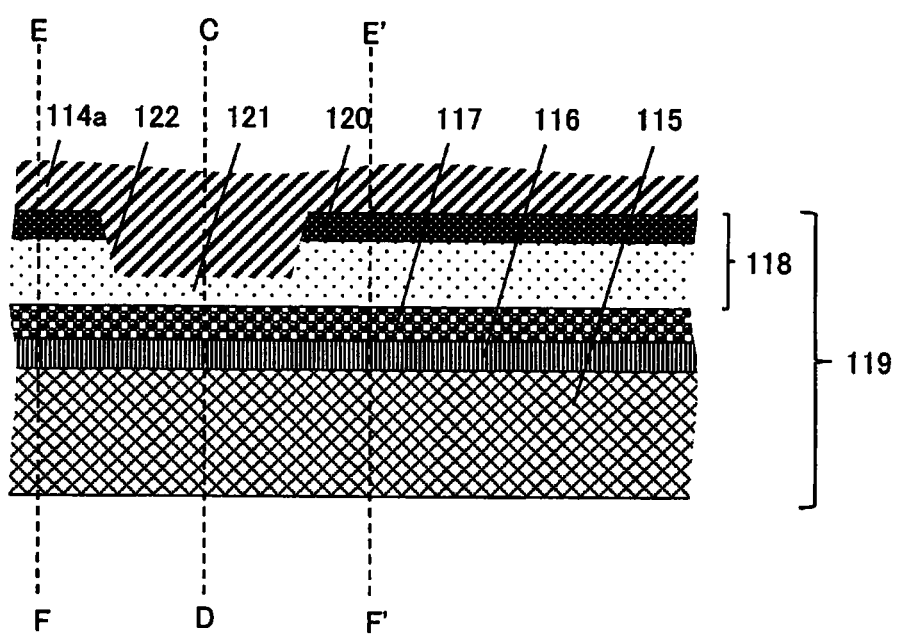
FIG. 7 is a panel sectional view illustrating an example of a preventive measure against peel-off of a very thin copper foil with a copper foil carrier during the process for manufacturing a semiconductor device in FIGS. 5A to 5J.
Figure 8:
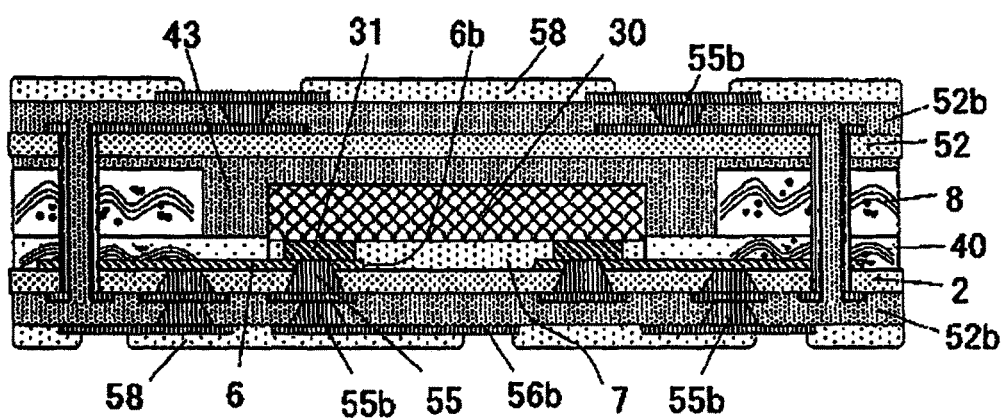
FIG. 8 is a diagram depicting a sectional structure of a conventional semiconductor device.
Figure 9:
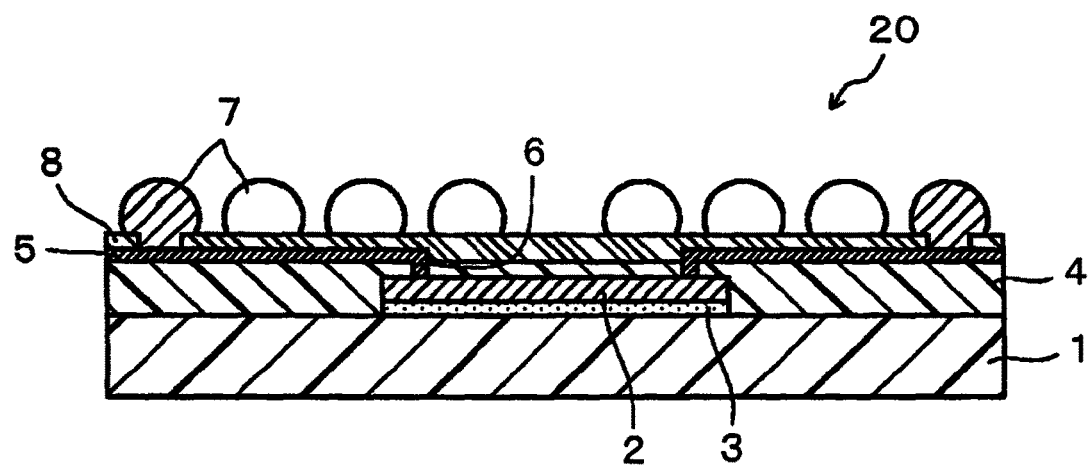
FIG. 9 is a diagram depicting a sectional structure of the conventional semiconductor device.

When the support plate 119 is stripped, the stripping is facilitated by cutting the panel at a dotted line A-B in FIG. 6 to expose the boundary ends of the copper foil carrier 121 and the very thin copper foil 120 again. Moreover, the panel may be split or cut during the manufacturing process, for example, in order to enhance process capability. In such a case, as a measure for preventing peel-off of the very thin copper foil with the copper foil carrier 118, as depicted in FIG. 7, half etching is performed on a part of the very thin copper foil with the copper foil carrier 118 located at the cut portion (depicted by a dotted line C-D in FIG. 7), down to the middle of the copper foil carrier 121 in a thickness direction to form a groove 122 in the very thin copper foil with the copper foil carrier 118, and the groove is then filled with the first interlayer insulating material 114a. Filling with the first interlayer insulating material 114a allows the first interlayer insulating material 114a to cover and protect the boundary ends of the copper foil carrier 121 and the very thin copper foil 120 resulting from the splitting or cutting of the panel. When the support plate 119 is stripped, the stripping is facilitated by cutting the panel at a dotted lines E-F and E'-F' in FIG. 7 to expose the boundary ends of the copper foil carrier 121 and the very thin copper foil 120 again.

Then, as depicted in FIG. 5B, the metal thin-film wiring layer 102 including the external electrodes 102a is formed on the very thin copper foil 120 by the semi additive process. The present invention is not limited to the semi additive process. However, the application of the semi additive process is preferable in that the very thin copper foil 120 can be used as a seed layer for copper electroplating and that the process is suitable for miniaturization of circuits.

Then, as depicted in FIG. 5C, the first interlayer insulating material 114a is laminated on the metal thin-film wiring layer 102 including the external electrodes 102a to form the first insulating material layer 101.

Then, as depicted in FIG. 5D, the semiconductor elements 107a and 107b are mounted on the first insulating material layer 101 via the adhesive 104 such that the electrodes 106 face upward.

Then, as depicted in FIG. 5E, the second interlayer insulating material 114b is used to seal the semiconductor elements 107a and 107b and peripheries thereof. Then, a conventional technique such as $CO_2$ laser processing or UV-YAG laser processing is used to drill the second interlayer insulating material 114b to form the metal vias 109 that reach the metal thin-film wiring layer 102 including the external electrodes 102a and the electrodes 106 of the semiconductor elements 107a and 107b.

Then, as depicted in FIG. 5F, a conventional technique such as the semi additive process or an MSAP process is used to execute circuit formation to form the metal thin-film wiring layer 102 on the second interlayer insulating material 114b while forming the metal vias 109. The formation of the second interlayer insulating material 114b, the drilling, and the circuit formation are repeated to form the second insulating material layer 108.

Then, as depicted in FIG. 5G, the solder resist layer 110 is formed by photolithography. The electronic components 112a and 112b are mounted using the solder material 111.

Then, as depicted in FIG. 5H, a conventional molding technique such as transfer molding, compression molding, or injection molding is used to seal the electronic components 112a and 112b with the insulating resin 113, and the insulating resin 113 is thermally cured. However, the sealing method varies depending on the form of the insulating resin 113, and coating with a liquid resin, vacuum lamination of a resin sheet, or the like is applied. At this time, the gap between the second insulating material layer 108 and the electronic components 112a and 112b is completely filled with the insulating resin 113 (MUF: Molded Underfill), which secures a long-time reliability of the semiconductor device. When the insulating resin is used as the warpage adjustment layer, for example, a TMV (Through Mold Via) technique is used to allow electric connection to the warpage adjustment layer, enabling package lamination. However, when the insulating resin 113 is provided with the function of the solder resist layer 110, the MUF is not applied.

Figure 5J:
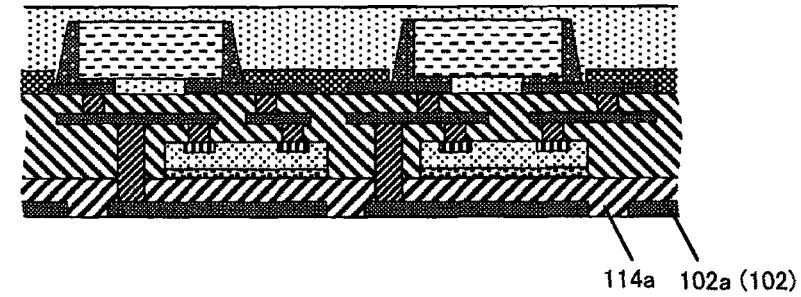

Then, as depicted in FIG. 5I, the support plate 119 is stripped from the panel. The very thin copper foil 120 is etched away using a mixture of hydrogen peroxide and sulfuric acid, a water solution of persulfate, or the like to expose the front surface of the metal thin-film wiring layer 102 including the external electrodes 102a as depicted in FIG. 5J.

At this time, the first interlayer insulating material 114a has a surface roughness and may involve residual copper and may thus be etched back so as to be recessed 1 μm to 5 μm from the resin surface.

The rigidity provision function of the support plate 119 is handed over to the insulating resin 113 and the electronic components 112a and 112b during the process to allow the warpage characteristics of flowing products and finished products to be maintained during a manufacturing backend process without degradation. Then, a blade or the like is used to divide the panel into pieces to obtain the semiconductor device 100 according to the first embodiment.

Methods for manufacturing the semiconductor devices according to the second embodiment and the third embodiment of the present invention are basically the same as the method for manufacturing the semiconductor device according to the first embodiment in element techniques for the manufacturing steps except for the numbers of the first insulating material layers 101 and the second insulating material layers 108. Thus, a manufacturing process similar to the manufacturing process illustrated in FIGS. 5A to 5J may be applied as needed.

What is claimed is:

1. A method for manufacturing a semiconductor device, the method including:
    a step of forming a metal thin-film wiring layer on a front surface of a support plate;
    a step of laminating a first interlayer insulating material which does not contain reinforced fibers on the metal thin-film wiring layer to form a first insulating material layer;
    a step of mounting semiconductor elements on the first insulating material layer via an adhesive such that element circuit surfaces having electrodes face upward;
    a step of enclosing the semiconductor elements and peripheries thereof with a second interlayer insulating material which does not contain reinforced fibers;
    a step of forming, in the second interlayer insulating material, metal via holes that reach the metal thin-film wiring layer and the electrodes of the semiconductor elements;
    a step of forming a metal thin-film wiring layer and metal vias on the second interlayer insulating material;
    a step of forming a second insulating material layer by repeating the steps of forming the second interlayer insulating material, forming the holes, and forming the metal thin-film wiring layer and the metal vias;
    a step of forming a warpage adjustment layer made of an insulating resin, on the second insulating material layer; and
    a step of peeling off the support plate from the first insulating material layer to expose a surface of the metal thin-film wiring layer,
    the warpage adjustment layer having a physical property of offsetting warpage of the first insulating material layer and the second insulating material layer to reduce warpage of the semiconductor device.

2. The method of manufacturing a semiconductor device according to claim 1, wherein the support plate comprises a flat plate and a stress relaxation layer formed on the flat plate, and the step of peeling off the supporting plate from the first insulating material layer is performed by peeling off the stress relaxation layer from the first insulating material layer.

3. The method of manufacturing a semiconductor device according to claim 1, wherein the support plate comprises a flat plate, a stress relaxation layer formed on the flat plate, and a very thin copper foil with a copper foil carrier adhered on the stress relaxation layer, the metal thin-film wiring layer is formed on the very thin copper foil, and the step of peeling off the support plate from the first insulating material layer is performed by peeling off the copper foil carrier from the very thin copper foil.

4. The method of manufacturing a semiconductor device according to claim 2, in which under the same temperature condition, when the flat plate is assumed to have a modulus of elasticity A, the stress relaxation layer is assumed to have a modulus of elasticity B, and the first insulating material layer is assumed to have a modulus of elasticity C, a relation of A>C>B or C>A>B holds.

5. A method for manufacturing a semiconductor device, the method including:
    a step of forming a metal thin-film wiring layer on a front surface of a support plate;
    a step of laminating a first interlayer insulating material which does not contain reinforced fibers on the metal thin-film wiring layer to form a first insulating material layer;
    a step of mounting semiconductor elements on the first insulating material layer via an adhesive such that element circuit surfaces having electrodes face upward;
    a step of enclosing the semiconductor elements and peripheries thereof with a second interlayer insulating material which does not contain reinforced fibers;
    a step of forming, in the second interlayer insulating material, metal via holes that reach the metal thin-film wiring layer and the electrodes of the semiconductor elements;
    a step of forming a metal thin-film wiring layer and metal vias on the second interlayer insulating material;
    a step of forming a second insulating material layer by repeating the steps of forming the second interlayer insulating material, forming the holes, and forming the metal thin-film wiring layer and the metal vias;
    a step of forming a solder resist layer on the second insulating material layer and mounting electronic components;
    a step of enclosing the electronic components with an insulating resin to form a warpage adjustment layer; and
    a step of peeling off the support plate from the first insulating material layer to expose a front surface of the metal thin-film wiring layer,
    the warpage adjustment layer having a physical property of offsetting warpage of the first insulating material layer and the second insulating material layer to reduce warpage of the semiconductor device.

* * * * *